United States Patent
Remington, Jr. et al.

(10) Patent No.: US 7,211,513 B2
(45) Date of Patent: May 1, 2007

(54) PROCESS FOR CHEMICAL VAPOR DESPOSITION OF A NITROGEN-DOPED TITANIUM OXIDE COATING

(75) Inventors: Michael R. Remington, Jr., Toledo, OH (US); Srikanth Varanasi, Toledo, OH (US); David A. Strickler, Toledo, OH (US)

(73) Assignee: Pilkington North America, Inc., Toledo, OH (US)

( * ) Notice: Subject to any disclaimer, the term of this patent is extended or adjusted under 35 U.S.C. 154(b) by 415 days.

(21) Appl. No.: 10/825,889

(22) Filed: Apr. 15, 2004

(65) Prior Publication Data

US 2005/0003644 A1 Jan. 6, 2005

Related U.S. Application Data

(60) Provisional application No. 60/484,088, filed on Jul. 1, 2003.

(51) Int. Cl.
*H01L 21/44* (2006.01)

(52) U.S. Cl. ............... 438/680; 438/513; 438/477; 257/E21; 257/17; 257/274; 257/311

(58) Field of Classification Search ............. 438/680, 438/513, 584, 502, 509, 476, 477, 530, 627, 438/679, 683, 685, 647, 656
See application file for complete search history.

(56) References Cited

U.S. PATENT DOCUMENTS

| | | | | |
|---|---|---|---|---|
| 4,918,138 | A * | 4/1990 | Hara et al. | 524/785 |
| 5,981,426 | A * | 11/1999 | Langford et al. | 502/309 |
| 6,180,548 | B1 * | 1/2001 | Taoda et al. | 501/137 |
| 6,306,343 | B1 * | 10/2001 | Sugiyama | 422/4 |
| 6,680,277 | B2 * | 1/2004 | Morikawa et al. | 502/182 |
| 7,071,139 | B2 * | 7/2006 | Gole | 502/200 |

FOREIGN PATENT DOCUMENTS

WO  WO 98/41480  9/1998

* cited by examiner

*Primary Examiner*—David Nhu
(74) *Attorney, Agent, or Firm*—Marshall & Melhorn, LLC

(57) ABSTRACT

Nitrogen doped titanium oxide coatings on a hot glass substrate are prepared by providing a uniform vaporized reactant mixture containing a titanium compound, a nitrogen compound and an oxygen-containing compound, and delivering the reactant mixture to the surface of a ribbon of hot glass, where the compounds react to form a nitrogen doped titanium oxide coating. The nitrogen doped titanium oxide coatings deposited in accordance with the invention demonstrate an increase in visible light absorption.

23 Claims, 3 Drawing Sheets

Absorption Curves: TiO2:N

PROCESS FOR CHEMICAL VAPOR DESPOSITION OF A NITROGEN-DOPED TITANIUM OXIDE COATING

RELATED APPLICATION

This application claims the benefit, under 35 U.S.C. §119(e), of U.S. Provisional Patent Application Ser. No. 60/484,088 filed Jul. 1, 2003, which application is incorporated herein in its entirety.

FIELD OF THE INVENTION

The present invention relates generally to a process for forming a titanium oxide coating on glass and more particularly to a process for preparing a titanium oxide coating doped with nitrogen and depositing same by chemical vapor deposition on a hot glass substrate.

BACKGROUND OF THE INVENTION

Typically, coated glass articles are produced by continuously coating a glass substrate while it is being manufactured in a process known in the art as the "Float Glass Process." This process involves casting glass onto a molten tin bath which is suitably enclosed, then transferring the glass, after it has sufficiently cooled, to take-away rolls which are aligned with the bath, and finally cooling the glass as it advances across the rolls, initially through a lehr and thereafter while exposed to the ambient atmosphere. A non-oxidizing atmosphere is maintained in the float portion of the process, while the glass is in contact with the molten tin bath, to prevent oxidation. An air atmosphere is maintained in the lehr. The chemical vapor deposition (CVD) of various coatings may be conveniently performed in the bath or the lehr, or even in the transition zone therebetween, by contacting the surface of the hot glass with chemical vapor-containing reactants which pyrolytically decompose to form the metal oxide coating. This, of course, requires that the chemical reactants have vaporization temperatures below their thermal decomposition temperatures. A number of metal-containing compounds exist which may be vaporized to prepare a metal oxide coating on glass by CVD technology. Of particular interest are titanium compounds which are vaporized to form titanium oxide coatings.

The desirable performance characteristics of certain metal oxide coatings, such as titanium oxide coatings, on glass, for example, photocatalytic activity, hydrophilicity, high light transmittance, high infrared reflectivity, etc., can be improved by the incorporation of a dopant into the metal oxide coating. Among the materials used in the prior art as dopants for titanium oxide is nitrogen. Typically, nitrogen doped titanium oxide ($TiO_2$:N) coatings and films have been prepared by physical vapor deposition (PVD) such as direct current magnetron sputtering etc. To be compatible with the float glass process, the coatings must be formed by chemical deposition methods, such as chemical vapor deposition (CVD), preferably atmospheric pressure chemical vapor deposition (APCVD).

The physical form of the reactants employed in glass coating processes is generally a liquid, solid, vaporized liquid or solid, liquid or solid dispersed in a carrier gas mixture, or vaporized liquid or solid dispersed in a carrier gas mixture. The chemical vapor deposition process generally employs a vaporized liquid or solid, which is typically dispersed in a carrier gas mixture.

It is further known to deposit thin coatings having one or more layers with a variety of properties onto glass substrates. One property of interest is photocatalytic activity which arises by photogeneration, in a semi-conductor, of a hole-electron pair when the semi-conductor is illuminated by light of a particular frequency. The hole-electron pair can be generated in sunlight and can react in humid air to form hydroxy and peroxy radicals on the surface of the semi-conductor. The radicals oxidize organic grime on the surface which both cleans the surface and increases the hydrophilic properties (i.e. wettability) of the surface. A hydrophilic surface is beneficial because water will wet the surface better, making the surface easier to clean with water containing little or no detergent. In addition, water droplets will spread over the surface reducing the distracting visual effects of rain or spray. Thus, photocatalytically active coated glass has a use in self-cleaning glass windows.

Commonly, $TiO_2$ only becomes photocatalytic and hydrophilic upon irradiation with UV light ($\lambda<400$ nm). It is known that doping $TiO_2$ with certain metals, and more recently, with anions as described in the publication "Visible Light Photocatalysis in Nitrogen-Doped Titanium Oxides," Asahi, R. et al., Science, Vol 293, p. 269–271 (2001), can introduce a visible absorption band into the $TiO_2$ which may lead to visible light activated photocatalysis. The thin films described in the Asahi, et al. article are formed by physical vapor deposition processes.

Titanium dioxide may be deposited onto glass to form a transparent coating with photocatalytic properties. In WO 98/06675, a chemical vapor deposition process is described for depositing titanium oxide coatings on hot flat glass at high deposition rate. In EP 901 991 A2, a photocatalytic active titanium oxide coating deposited by CVD is disclosed.

U.S. Pat. No. 6,306,343 describes a method of decomposing material by contacting the subject material with a photocatalyst exposed to light including visible light. The photocatalyst is said to be formed by subjecting $TiO_2$ to plasma CVD treatment, where the plasma contains a mixed gas of a hydrocarbon and a reducing agent.

Published U.S. patent application Ser. No. 20020012779 A1 describes a multi-layer film of the form substrate/$TiO_2$/$TiO_2$—$SiO_2$. This film stack is said to exhibit photocatalytic properties upon exposure to visible light.

Published U.S. patent application Ser. No. 20020151434 A1 describes a photo-catalyst comprising an oxynitride containing at least one transition metal wherein the transition metal is one chosen from the group, La, Ta, Nb, Ti and Zr, or Ca, Sr, Ba, K, and Rb. The oxynitride thus formed is said to be responsive to visible light.

SUMMARY OF THE INVENTION

The present invention is directed to a chemical vapor deposition process for depositing a nitrogen doped titanium oxide on a hot glass substrate. The process comprises:

providing a heated glass substrate with at least one major surface;

providing a uniform vaporized reactant mixture comprising a titanium compound, an oxygen-containing compound and a nitrogen compound;

delivering the vaporized reactant mixture to the major surface of the hot glass substrate where the reactant mixture reacts to deposit a coating of a nitrogen doped titanium oxide on the major surface of the hot glass substrate; and cooling the coated glass substrate to ambient temperature.

DETAILED DESCRIPTION OF THE PREFERRED EMBODIMENT

Figure 1:
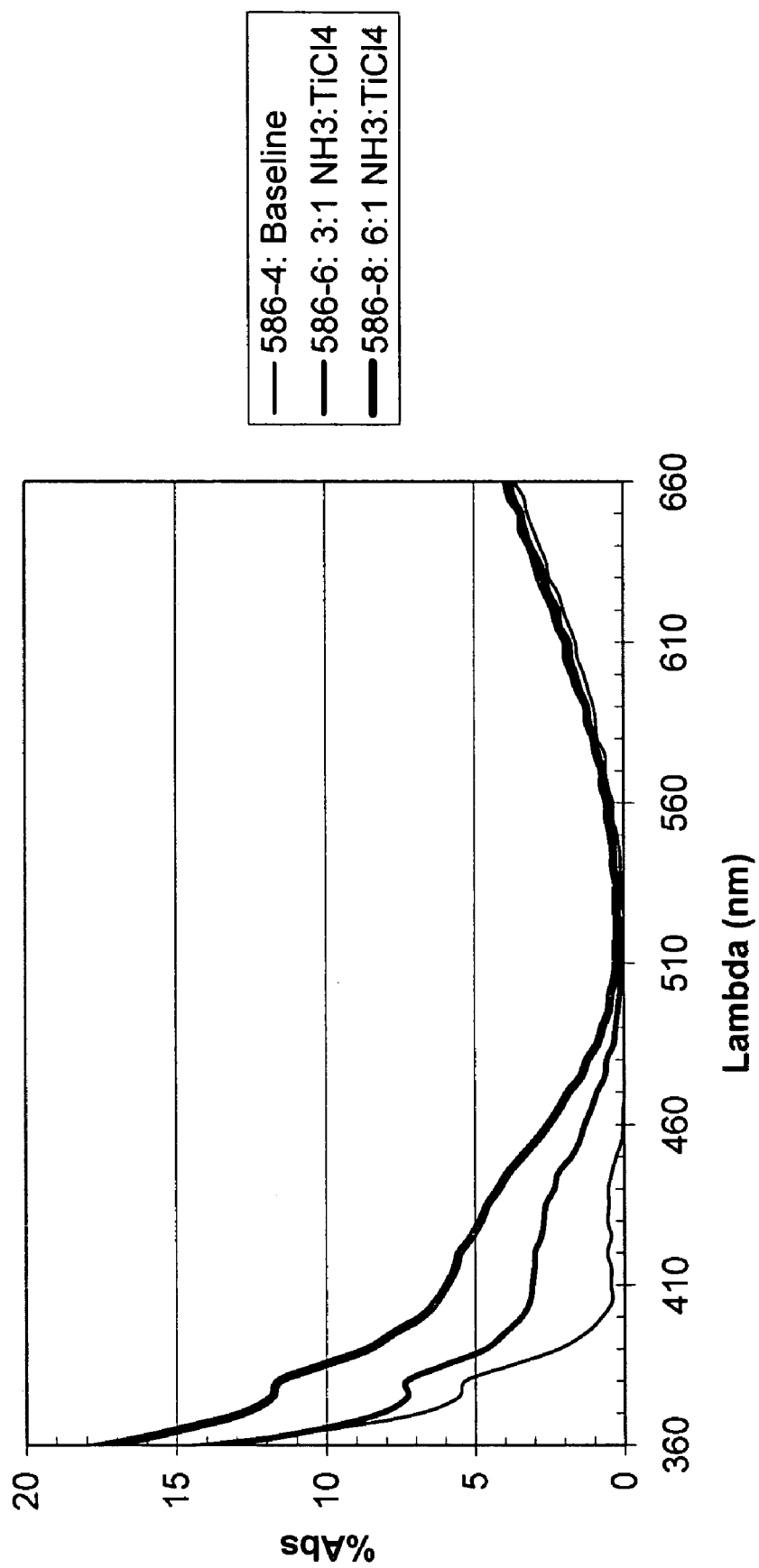
FIG. 1—Graphical representation of absorption curves comparing substantially undoped $TiO_2$ and nitrogen doped $TiO_2$ coatings produced in examples 1–3.

Titanium oxide coatings, particularly titanium oxide coatings doped with nitrogen, may be deposited onto the surface of a hot glass substrate by a process generally known in the art as chemical vapor deposition (CVD). Particularly suitable for the process of the present invention is atmospheric chemical vapor deposition (APCVD). In accordance with the process of the invention, the reactants are combined so as to form a uniform, vaporized reactant stream which is delivered to the surface of the hot glass substrate, wherein the vaporized reactant stream reacts to deposit a coating of nitrogen doped titanium oxide on the surface of the hot glass substrate. In the oxidizing atmosphere, which must exist at the surface of the hot glass, both organic and inorganic titanium compounds, preferably halogenated inorganic titanium compounds, pyrolytically decompose to form a titanium oxide coating.

The process is typically conducted during the manufacture of glass by the float glass process, and occurs in the float bath, the lehr, or in the transition zone between the bath and the lehr, while the glass is still hot. The glass substrate is generally provided at a temperature in the range from about 750° F. to about 1500° F. These are typical temperatures for glass during various stages as it is manufactured by the float glass process. More specifically, the coating process is conducted at temperatures in the range of 900–1350° F., preferably in the range of 1100–1280° F.

The glass substrates suitable for use in the process according to the present invention include any of the conventional glass substrates known in the art for the preparation of coated glass articles. A typical glass substrate, used in the manufacture of automotive and architectural glass, is commonly referred to as soda-lime-silica glass. Other suitable glasses may be generally designated as alkali-lime-silica glass, boro-silicate glass, alumino-silicate glass, boro-alumino silicate glass, phosphate glass, fused silica, etc., as well as combinations thereof. A preferred glass is soda-lime-silica glass.

The CVD reactant stream of this invention preferably includes a titanium coating compound which is vaporized and conveyed to a point at or near the surface of the advancing glass ribbon. Suitable titanium compounds useful for practicing the invention include, for example, compounds of the form $TiX_4$, $Ti(OR)_4$ and $Ti(NR_2)_4$ where X=a halogen and R=an organic alkyl chain containing 1–4 carbon atoms, and the like, as well as combinations thereof. These compounds are generally well known in the art of CVD technology, as well as commercially available, as precursors for applying a titanium oxide coating on hot glass. A preferred titanium compound is titanium tetrachloride. The titanium compound, a carrier gas, oxidizer, and optionally, a stabilizer, hydrocarbon, inert gas, and the like, are vaporized to form a gaseous reactant stream. The term gaseous reactant stream, as used herein, typically comprises a vaporized titanium compound, an oxidizer, and an inert carrier gas.

The vaporized titanium compound may be prepared by any of the procedures generally known in the art, such as, for example, the vaporization of dispersed or fluidized powders, the vaporization of particles in a packed bed by a hot carrier gas stream, the injection of a solubilized titanium compound into a hot carrier gas stream, or the bubbling of a carrier gas through a liquid titanium compound. A preferred method for preparing the reactant streams containing the vaporized titanium compounds is to vaporize the compound in a thin film evaporator in the presence of a blend gas, as is disclosed, for example, in U.S. Pat. No. 5,090,985, which is incorporated herein in its entirety by reference thereto. As noted above, this gaseous stream, which generally comprises an inert carrier gas such as helium, nitrogen, or argon, or mixtures thereof, also contains oxidizers such as water or oxygen. Preferred carrier gases are helium and nitrogen, and mixtures thereof, containing oxygen as an oxidizer. The resultant reactant stream containing the vaporized titanium-compound is generally heated to a temperature from about 250° F. to about 450° F., then conveyed to the reaction zone at the surface of the hot glass substrate, where temperatures at the face of the coater nearest the glass surface are less than or equal to approximately 550° F.

Preferably, a separate reactant stream containing a nitrogen compound, an oxidizer, and an inert carrier gas is another component of the coating system of the invention.

Nitrogen compounds useful in the invention can be generally described by the formulae:

$R_xNH_{3-x}$ where x=0–3 and R=an organic chain containing 1–4 carbon atoms

RCN where R=an organic chain containing 1–4 carbon atoms $R^1C(O)NR^2R^3$ where $R^1$=H or an organic chain containing 1–4 carbon atoms, $R^2$=H or an organic chain containing 1–4 carbon atoms and $R^3$=H or an organic chain containing 1–4 carbon atoms.

A preferred nitrogen compound is ammonia. Reference to "nitrogen compounds" herein does not include molecular nitrogen ($N_2$) as may be used as a carrier gas.

Oxygen—containing compounds useful in the invention can be generally described by the formula:

$R^1COOR^2$ where $R^1$=H or an organic chain containing 1–4 carbon atoms and $R^2$=an organic chain containing 2–4 carbon atoms.

A preferred oxygen-containing compound is ethyl acetate. Oxygen in the form of $O_2$ may also be used.

Reference to a "titanium compound", "an oxygen containing compound" and "nitrogen compound" may refer to two or three separate compounds. Where two compounds are used, one compound containing two of the required species of atoms such as $Ti(NR_2)_4$, $NO_x$ etc., are envisioned.

The nitrogen-containing reactant stream is, generally, combined with the titanium compound reactant stream at a point prior to delivery of the reactants to the surface of the hot glass substrate upon which the coating is to be deposited, but preferably in relatively close proximity thereto. The reactant stream containing the nitrogen compound may be prepared by vaporizing the compound using any suitable method, such as the methods discussed hereinabove relative to the vaporization of the titanium compound. The vaporized reactant stream containing the nitrogen compound may be combined with the reactant stream containing the vaporized titanium compound by blending the two gaseous streams prior to delivery to the surface of the hot glass substrate. Alternatively, the nitrogen-containing reactant stream in liquid or solution form may be injected into the hot reactant stream containing the vaporized titanium compound, thereby vaporizing the nitrogen-containing solution or liquid compound. After combination, the vaporized reactants of titanium, nitrogen, and an oxygen-containing compound are delivered to the surface of the hot glass, where they react together to deposit thereon a coating of nitrogen doped titanium oxide.

In a preferred embodiment, the titanium-containing reactant stream is formed by vaporizing titanium tetrachloride and an inert carrier gas, such as nitrogen, helium or a mixture thereof, in an evaporator such as that described above. The resulting gaseous reactant stream is then combined with a suitable gaseous nitrogen compound (as defined previously). At the same time, a suitable oxygen-containing compound (as defined previously) is vaporized, and the resulting gaseous reactant stream of the chosen nitrogen compound and oxygen containing compound vapor is combined with the gaseous titanium-containing reactant stream to form a uniform, gaseous reactant stream. The uniform, gaseous reactant stream is delivered to the surface of the hot glass substrate, wherein a coating of nitrogen doped titanium oxide is deposited on the surface of the hot glass substrate. The uniform, gaseous reactant stream may be delivered to the surface of the glass by any suitable coating device. One preferred coating device is illustrated in U.S. Pat. No. 4,504,526, which is incorporated herein in its entirety by reference thereto.

The uniform, gaseous reactant mixture which is delivered to the surface of the hot glass substrate in accordance with the invention preferably includes (all percentages being mole %) from about 0 to about 60% oxygen (supplied as $O_2$), from about 1% to about 30% nitrogen (as supplied by one of the compounds defined previously), and from about 1% to about 30% oxygen (as supplied by one of the oxygen containing compounds defined previously), and most preferably includes from about 0 to about 25% oxygen (supplied as $O_2$), from about 1% to about 20% nitrogen (as supplied by one of the compounds defined previously), and from about 1% to about 20% oxygen (as supplied by one of the oxygen containing compounds defined previously). The uniform, gaseous reactant mixture also includes a titanium compound, the desired concentration of which is a function of the desired thickness of the titanium oxide coating and the line speed of the substrate. Thus, as will be appreciated by those skilled in the art, the titanium compound is provided in the gaseous reactant mixture in an amount sufficient to apply a coating of the desired thickness at the desired line speed of the substrate. For typical commercial operations, the gaseous reactant mixture will generally include from about 0.5% to about 5% of the titanium compound.

As previously noted, nitrogen-doped titanium coatings have been formed by physical vapor deposition (PVD) processes, for example direct current magnetron sputtering. PVD processes are capable of forming complex film stacks, but it is costly to produce films by such processes and the films produced are so-called "soft-coat" films which are prone to damage by routine physical contact. They may also be more readily subject to degradation on exposure to common chemicals. It is particularly worth noting that producing $TiO_2$:N films by PVD methods is difficult, as the deposition rates tend to be low, and obtaining films of desired thickness is costly. Finally, PVD filming processes must be accomplished on a static substrate in an evacuated chamber and, depending on the size and sophistication of the coating chamber, may have to undergo multiple "passes" through the coating chamber to form the desired multi-layer film stack. Thus, such PVD processes are slow, which is clearly undesirable in high volume glass manufacturing processes.

By contrast, the process of the present invention allows for "on-line" coating on the float glass line, which is a much more efficient means of thin-film production. Production efficiency usually translates into cost savings and such is believed to be the case with the process of the present invention. Additionally, chemical vapor deposition produces "pyrolytic" coatings which are much more durable than "soft-coats." In order for CVD processes to be successful, the previously described reactant streams must chemically react to form the various layers of the film stack within a few seconds for each layer, as the glass ribbon is typically moving below the coating devices at a rate of 200 to 600 inches per minute. Preferably, the CVD process of the present invention is conducted at essentially atmospheric pressure, thus eliminating the need for large vacuum chambers.

In the $TiO_2$:N films deposited in accordance with the invention, it has been found that introduction of the nitrogen dopant is evidenced by a previously unseen optical absorption band in the visible portion of the electromagnetic spectrum, as illustrated in FIG. 1. This new optical absorption band allows for an increase in visible light absorption, thus improving the efficiency at which the coating can readily utilize the available photons in the solar spectrum and may shift the photocatalytic performance of the coating into the visible region of the electromagnetic spectrum.

Figure 2:
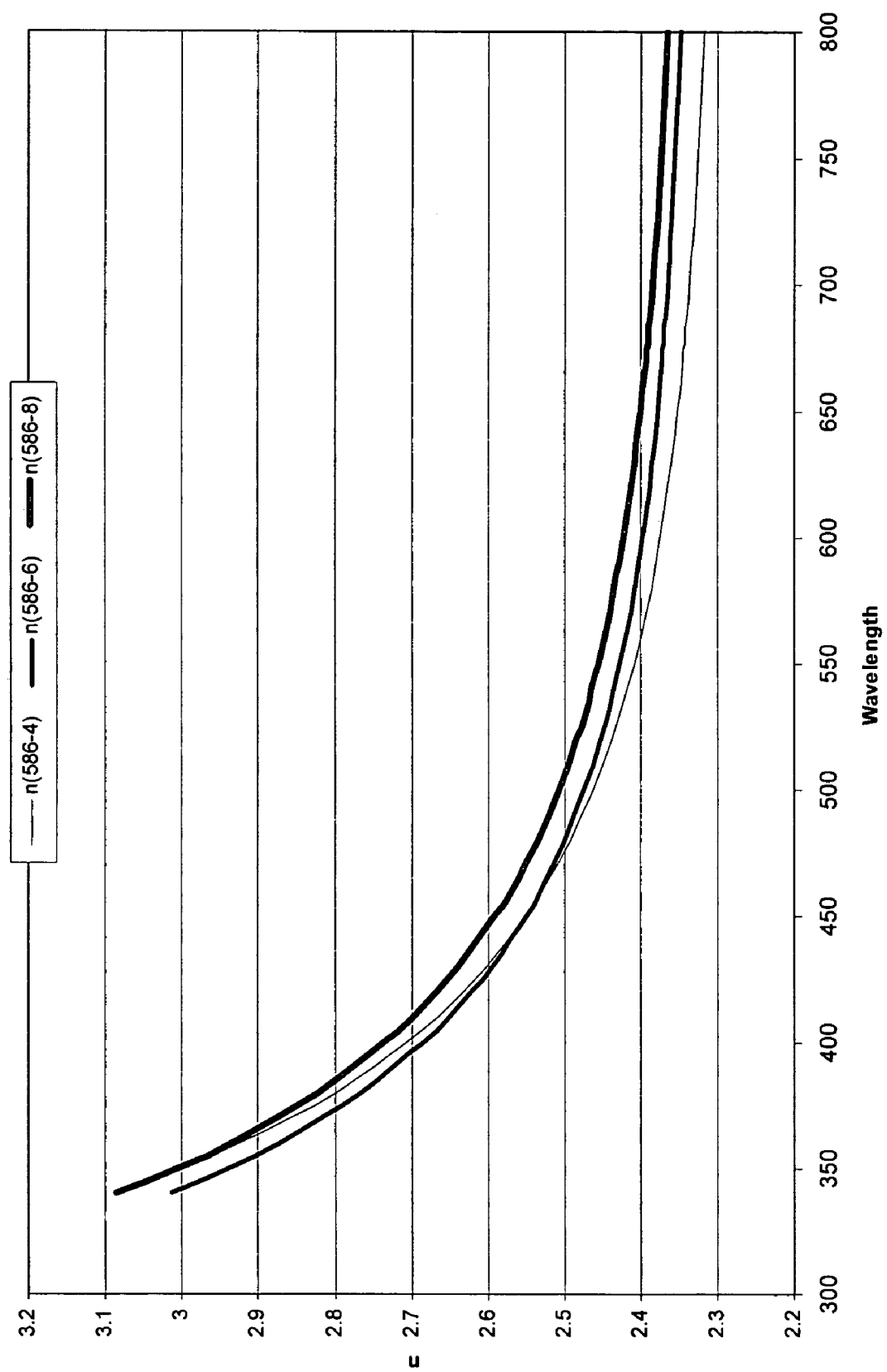
FIG. 2—Graphical representation of the comparative refractive indices of substantially undoped $TiO_2$ and nitrogen doped $TiO_2$ produced in Examples 1–3 as a function of wavelength in the UV and visible portions of the spectrum.
Figure 3:
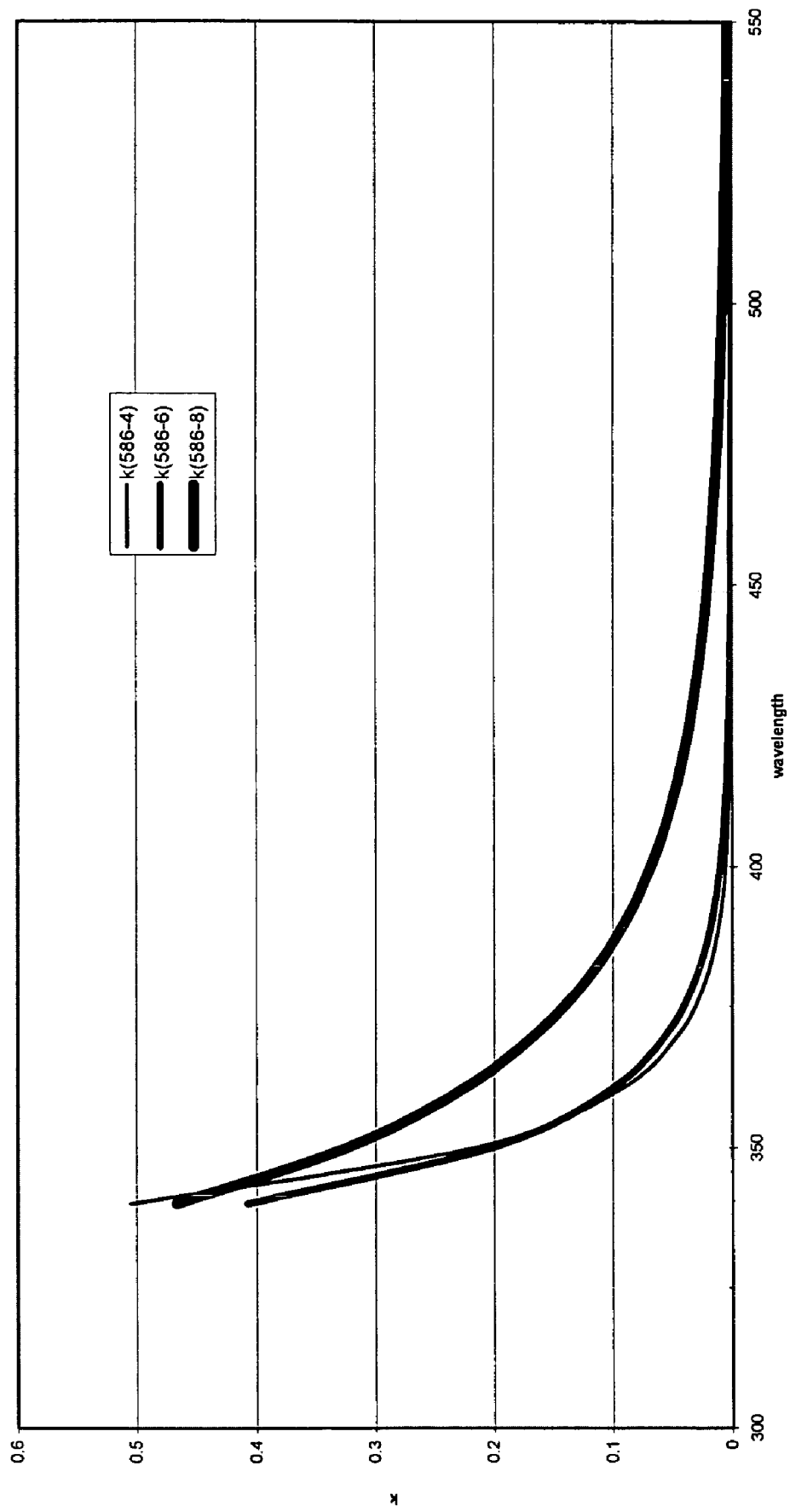
FIG. 3—Graphical representation of the comparative extinction coefficients of substantially undoped $TiO_2$ and nitrogen doped $TiO_2$ as a function of wavelength in the UV and visible portions of the spectrum.

Further evidence for the incorporation of nitrogen into the $TiO_2$ coatings of the invention is that the optical constants n (refractive index) and k (extinction coefficient) also change in the visible portion of the spectrum. For coatings doped with nitrogen, both n and k increase in the visible portion of the spectrum compared to the undoped $TiO_2$ coatings (See FIGS. 2, 3 and Table I).

It has also been found to be preferable, when forming a nitrogen doped titanium oxide coating in accordance with this invention, to apply a layer of a material which acts as a sodium diffusion barrier between the glass substrate and the nitrogen doped titanium oxide coating. Coated glass articles have been found to exhibit lower haze when the nitrogen doped titanium oxide coating deposited in accordance with the invention is applied to the glass with a sodium diffusion layer therebetween, as opposed to directly on the glass. This sodium diffusion layer is preferably formed of silica. The layer of silica is preferably formed using conventional CVD techniques.

In a more preferred embodiment, a thin film of tin oxide is first deposited on the surface of the hot glass substrate, with a thin film of silica deposited thereover, so that an underlayer structure of tin oxide/silica is formed intermediate the glass and the subsequently deposited layer of nitrogen doped titanium oxide. In this embodiment, the silica film not only acts as a sodium diffusion barrier but, in combination with the first (undoped) tin oxide film, helps to suppress iridescence in the resulting coated glass article. The use of such anti-iridescent layers is disclosed in U.S. Pat. No. 4,377,613, which is incorporated herein in its entirety by reference thereto.

It must be noted that the process conditions are not sharply critical for the successful combining and delivering of vaporized reactants according to the present invention. The process conditions described hereinabove are generally disclosed in terms which are conventional to the practice of this invention. Occasionally, however, the process conditions as described may not be precisely applicable for each compound included within the disclosed scope. Those compounds for which this occurs will be readily recognizable by those of ordinary skill in the art. In all such cases, either the process may be successfully performed by conventional modifications known to those of ordinary skill in the art, e.g., by increasing or decreasing temperature conditions, by varying the rates of combination of the titanium and nitrogen containing reactants, by routine modifications of the vaporization process conditions, etc., or other process conditions which are otherwise conventional will be applicable to the practice of the invention.

It will also be noted that the process of the invention may be repeated as desired on a given substrate so as to form a coating consisting of several successive layers, the composition of each of the layers not necessarily being identical. It is, of course, obvious that for a given flow rate of the reactants, the thickness of a coating layer depends on the rate of movement of the substrate. Under these conditions, the reaction stations may, if desired, be multiplied by juxtaposing two or more coating devices. In this way, successive layers are superimposed before the layers have had time to cool, producing a particularly homogenous overall coating.

The present invention has many potential benefits. Of these benefits, of particular importance is the possibility of obtaining photocatalytic properties of the films produced upon exposure to not only UV light, but to visible light as well. Photocatalytic activity in the visible light portion of the electromagnetic spectrum would greatly expand the potential uses of such filmed products, particularly for interior applications where exposure to UV light is minimal, or non-existent. The "self-cleaning" properties of photocatalytic coatings could be as beneficial in such interior applications as they are in applications where the glass is exposed to the external environment.

The invention is more easily comprehended by reference to specific embodiments which are representative of the invention. It must be understood, however, that the specific embodiments are provided only for the purpose of illustration, and that the invention may be practiced otherwise than as specifically illustrated without departing from its spirit and scope.

EXAMPLES

Examples 1 through 3

The following experimental conditions are applicable to Examples 1 through 3.

A laboratory furnace having a moving conveyor to move a glass sheet, or sheets, through said furnace at a rate of 200 inches/minute (unless otherwise specified), also contains a single, 10-inch wide, bi-directional coater, the coater being suitable for Examples Examples 1 through 3

The following experimental conditions are applicable to Examples 1 through 3.

A laboratory furnace having a moving conveyor to move a glass sheet, or sheets, through said furnace at a rate of 200 inches/minute (unless otherwise specified), also contains a single, 10-inch wide, bi-directional coater, the coater being suitable for conveying vaporized reactants to the surface of the glass sheets in order to form a film or film stack by chemical vapor deposition.

The glass sheets are heated to approximately 1170° F., while the coater, at the reactor face, i.e., the portion nearest the glass surface, is at a temperature of approximately 500° F.

Preparation of the various precursor materials is accomplished by utilizing multiple source chambers known as "bubblers," there being a bubbler for each of titanium tetrachloride ($TiCl_4$) and ethyl acetate (EtOAc), which are maintained at the specified temperatures. Helium gas is introduced into both bubblers, at the specified flow rate.

The specific source or bubbler temperatures and the flow rates are as follows:

| Compound | Bubbler Temp (deg F.) | Carrier Flow Rates (slm) |
|---|---|---|
| $TiCl_4$ | 199.4 | 0.15–0.30 |
| EtOAc | 140 | 0.5–1.2 |

$NH_3$, in gaseous form, is introduced into the reactant stream at the specified flow rate.

Total Flow rates were between 30 and 32 slm. The specific conditions for the three examples are given below.

| Example | ID | Total Flow (slm) | Speed (ipm) | % $TiCl_4$ | % EtOAc | % $NH_3$ | $NH_3$:$TiCl_4$ |
|---|---|---|---|---|---|---|---|
| 1 | 568-4 | 31.1 | 200 | 0.37 | 3.35 | 0.0 | 0 |
| 2 | 568-6 | 31.4 | 200 | 0.36 | 3.31 | 1.1 | 3 |
| 3 | 568-8 | 30.2 | 125 | 0.19 | 1.72 | 1.2 | 6 |

The various reactants described above are combined in the coater to deposit a nitrogen-doped titanium oxide coating on, in this case, a clear soda-lime-silica glass sheet whereon a $SiO_2$ layer 200 Å thick had previously been deposited. Results are below.

TABLE 1

| Example | ID | Optical Thickness | % T | % R | % A | Avg. n (400–800 nm) | Avg. k (400–800 nm) |
|---|---|---|---|---|---|---|---|
| 1 | 568-4 | 444 | 65.6 | 33.8 | 0.6 | 2.425 | 0.000354 |
| 2 | 568-6 | 436 | 64.4 | 34.8 | 0.8 | 2.442 | 0.000734 |
| 3 | 568-8 | 370 | 66.8 | 32.2 | 1 | 2.470 | 0.009325 |

Where:
T = visible light transmittance (Illuminant C-10°)
R = visible light reflectance (film side)
A = visible light absorption The significant increases in the Avg. k between Examples 1 and 2, and between 2 and 3 clearly, indicate the presence of increasing levels of nitrogen dopant in the coatings produced.

More specifically, the nitrogen doped film of Example 2 shows an increase in the extinction coefficient (k) over the undoped film of Example 1 (the comparative example). Similarly, the still greater nitrogen content of Example 3 results in an increase of an order of magnitude in the extinction coefficient (k) over the undoped film of Example 1.

Stated another way, the observed increase in absorbed visible light of Example 2 over the level of absorption of Example 1 is approximately 33%, while the observed increase in absorbed visible light of Example 3 over Example 1 is an even more significant 67%.

The increase in visible light absorption of films produced by the present invention appears to be particularly noteworthy in the range of about 410–516 nm. The examples of Table 1 can be examined in the context of FIG. 1. At 410 nm, Example 1 (undoped) shows a visible light absorption of about 0.5%, whereas Examples 2 and 3 show an absorption of visible light of 3.1% and 6%, respectively. Thus, the nitrogen doped films of Examples 2 and 3 absorb about 6 and 12 times more visible light than Example 1 at 410 nm. Similarly, at 430 nm the films of Examples 2 and 3, respectively, absorb about 5 and 10 times more visible light than the undoped film of Example 1.

The invention has been disclosed in what is considered to be its preferred embodiment. It must be understood, however, that the specific embodiments are provided only for the purpose of illustration, and that the invention may be practiced otherwise than as specifically illustrated without departing from its spirit and scope.

We claim:

1. A chemical vapor deposition process for depositing a nitrogen doped titanium oxide coating on a hot glass substrate, comprising:
   a) providing a hot glass substrate having a major surface over which a nitrogen doped titanium oxide coating is to be deposited;
   b) providing a uniform, vaporized reactant mixture containing a titanium compound, an oxygen-containing compound, and a nitrogen compound;
   c) delivering the vaporized reactant mixture to the major surface of the hot glass substrate and reacting the vaporized reactant mixture to deposit a coating of nitrogen doped titanium oxide over the major surface of the hot glass substrate during manufacture of the glass substrate by a float glass manufacturing process; and
   d) cooling the coated glass substrate to ambient temperature.

2. The process of claim 1, wherein the titanium compound is chosen from the group consisting of $TiX_4$, $Ti(OR)_4$, and $Ti(NR_2)_4$ where X=a halogen and R=an organic alkyl chain containing 1–4 carbon atoms.

3. The process of claim 2 wherein the titanium compound comprises a halogenated titanium compound.

4. The process of claim 3 wherein the halogenated titanium compound comprises a chlorinated titanium compound.

5. The process of claim 4 wherein the chlorinated titanium compound comprises $TiCl_4$.

6. The process of claim 1 wherein the oxygen-containing compound is chosen from the group consisting of $O_2$ and $R^1COOR^2$ where $R^1$=H or an organic chain containing 1–4 carbon atoms and $R^2$=an organic chain containing 2–4 carbon atoms.

7. The process of claim 6 wherein the oxygen-containing compound comprises ethyl acetate.

8. The process of claim 1 wherein the nitrogen-containing compound is chosen from the group consisting of $R_xNH_{3-x}$, where x=0–3 and R=an organic chain containing 1–4 carbon atoms; RCN, where R=an organic chain containing 1–4 carbon atoms, $R^1C(O)NR^2R^3$, where $R^1$=H or an organic chain containing 1–4 carbon atoms, $R^2$=H or an organic chain containing 1–4 carbon atoms and $R^3$=H or an organic chain containing 1–4 carbon atoms and mixtures thereof.

9. The process of claim 8 wherein the nitrogen-containing compound comprises ammonia.

10. The process of claim 1 wherein the coating is deposited in, or adjacent to, the float bath.

11. The process of claim 10 wherein the coating is deposited at a temperature of from 900–1350° F.

12. The process of claim 11 wherein the coating is deposited at a temperature of from 1100–1280° F.

13. The process of claim 12 wherein the coating is deposited at atmospheric pressure.

14. The process of claim 13 wherein the nitrogen doped titanium oxide coating is deposited at a thickness of from 10 Å to 2500 Å.

15. The process of claim 14 wherein the nitrogen doped titanium oxide coating is deposited at a thickness of from 100 Å to 500 Å.

16. The process of claim 1 wherein a color suppressing coating is deposited on the major surface of the hot glass substrate prior to the deposition of the nitrogen doped titanium oxide coating thereon.

17. A chemical vapor deposition process for applying a nitrogen doped titanium oxide coating to a surface on a hot glass substrate comprising:
   a) providing a hot glass substrate, including a surface upon which a nitrogen doped titanium oxide coating is to be deposited;
   b) depositing a sodium diffusion barrier layer directly on said hot glass substrate;
   c) providing a uniform, vaporized reactant mixture comprising:
   a titanium compound, chosen from the group consisting of $TiX_4$, $Ti(OR)_4$ and $Ti(NR_2)_4$ where X=a halogen and R=an organic alkyl chain containing 1–4 carbon atoms; an oxygen-containing compound chosen from the group consisting of $O_2$ and $R^1$=H or an organic chain containing 1–4 carbon atoms and $R^2$=an organic chain containing 2–4 carbon atoms; a nitrogen-containing compound chosen from the group consisting of $R_xNH_{3-x}$, where x=0–3 and $R^2$=an organic chain containing 1–4 carbon atoms; RCN where R=an organic chain containing 1–4 carbon atoms; $R^1C(O)NR^2R^3$, where $R^1$=H or an organic chain containing 1–4 carbon atoms, $R^2$=H or an organic chain containing 1–4 carbon atoms and $R^3$=H or an organic chain containing 1–4 carbon atoms, and mixtures thereof; and
   d) delivering said vaporized reactant mixture to the surface of said hot glass substrate and reacting the vaporized reactant mixture to deposit a coating of nitrogen doped titanium oxide on said surface of said hot glass substrate; and
   e) cooling said coated glass substrate to ambient temperature.

18. The process of claim 17, wherein the sodium diffusion barrier layer comprises silica.

19. The process of claim 1 wherein the nitrogen doped titanium oxide coating exhibits an average extinction coefficient greater than $7 \times 10^{-4}$ in the range of 400–800 nm.

20. The process of claim 1 wherein the nitrogen doped titanium oxide coating absorbs at least 20% more light in the range of 400–800 nm than the undoped titanium oxide coating.

21. The process of claim 1 wherein the nitrogen doped titanium oxide coating exhibits absorption of light at a wavelength of greater than 400 nm to 600 nm.

22. A chemical vapor deposition process for applying a nitrogen doped titanium oxide coating to a surface on a hot glass substrate comprising:
   a) providing a hot glass substrate having a surface upon which a nitrogen doped titanium oxide coating is to be deposited;
   b) floating said hot glass substrate on a bath of molten tin in a controlled gaseous atmosphere;
   c) depositing a color-suppressing coating directly on the surface of the hot glass substrate upon which the nitrogen doped titanium oxide is to be deposited;
   d) providing a uniform, vaporized reactant mixture comprising titanium tetrachloride, ethyl acetate and ammonia;
   e) delivering said vaporized reactant mixture to the surface of said hot glass substrate under essentially, atmospheric pressure and reacting the mixture at a temperature of from 1100° F.–1280° F., to deposit a coating of nitrogen doped titanium oxide on said surface of said hot glass substrate; and
   f) cooling said coated glass substrate to ambient temperature.

23. The process of claim 1, wherein a sodium diffusion barrier layer coating is deposited on the major surface of the hot glass substrate prior to the deposition of the nitrogen doped titanium oxide coating thereon.

* * * * *